(12) United States Patent
Ou

(10) Patent No.: US 11,747,734 B2
(45) Date of Patent: Sep. 5, 2023

(54) STRIPPING-SOLUTION MACHINE AND WORKING METHOD THEREOF

(71) Applicant: TCL China Star Optoelectronics Technology Co., Ltd., Shenzhen (CN)

(72) Inventor: Tian Ou, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/754,760

(22) PCT Filed: Dec. 24, 2019

(86) PCT No.: PCT/CN2019/127774
§ 371 (c)(1),
(2) Date: Apr. 9, 2020

(87) PCT Pub. No.: WO2021/098002
PCT Pub. Date: May 27, 2021

(65) Prior Publication Data
US 2022/0413390 A1   Dec. 29, 2022

(30) Foreign Application Priority Data

Nov. 19, 2019 (CN) .......................... 201911132279.8

(51) Int. Cl.
| | |
|---|---|
| *G03D 5/00* | (2006.01) |
| *G03F 7/42* | (2006.01) |
| *B01D 29/50* | (2006.01) |
| *B01D 29/60* | (2006.01) |
| *B01D 29/90* | (2006.01) |

(52) U.S. Cl.
CPC ............. *G03F 7/422* (2013.01); *B01D 29/50* (2013.01); *B01D 29/60* (2013.01); *B01D 29/90* (2013.01)

(58) Field of Classification Search
CPC .................................................. H01L 21/30625
USPC ...................................................... 156/345.11
See application file for complete search history.

(56) References Cited

U.S. PATENT DOCUMENTS

| | | | |
|---|---|---|---|
| 2004/0011463 A1* | 1/2004 | Nakagawa ........ | H01L 21/67207 156/345.18 |
| 2007/0235132 A1* | 10/2007 | Park ........................ | G03F 7/422 216/90 |
| 2020/0176276 A1 | 6/2020 | Ou et al. | |

FOREIGN PATENT DOCUMENTS

| | | |
|---|---|---|
| CN | 101051190 A | 10/2007 |
| CN | 101199038 A | 6/2008 |
| CN | 101943868 A | 1/2011 |
| CN | 203736950 U | 7/2014 |
| CN | 203786466 U | 8/2014 |
| CN | 105118770 A | 12/2015 |
| CN | 205248245 U | 5/2016 |

(Continued)

*Primary Examiner* — Gregory E Webb
(74) *Attorney, Agent, or Firm* — PV IP PC; Wei Te Chung; Zhigang Ma

(57) ABSTRACT

A stripping-solution machine and working method thereof are provided. The stripping-solution machine includes: a plurality stages of chambers, which are arranged sequentially in order, wherein each stage of the chamber is correspondingly connected to a storage box; at least one filter device, wherein one end of the filter device is disposed to be connected to a storage box corresponding to a current stage chamber by a first pipe, and another end of the filter device is connected to a next stage chamber by a second pipe. Furthermore, a plurality of valve switches are at least disposed on the first pipe or the second pipe.

11 Claims, 5 Drawing Sheets

(56) References Cited

FOREIGN PATENT DOCUMENTS

| CN | 108054119 A | 5/2018 |
|----|-------------|--------|
| JP | H03222408 A | 10/1991 |

* cited by examiner

STRIPPING-SOLUTION MACHINE AND WORKING METHOD THEREOF

FIELD OF INVENTION

The present disclosure relates to the field of semiconductor processing technology, and specifically relates to a stripping-solution machine and working method thereof.

BACKGROUND OF INVENTION

Lift-off processes are generally used in reducing photomasks of processes of thin film transistors. A lift-off process is that forming photoresists and patterning first, and then forming a film on the photoresists, while removing the photoresists, film layers deposited on the photoresists are also lifted off, thereby completing patterning of the film layers. By the process, combining twice of photolithographies into once can be realized to achieve the purpose of reducing photomasks.

In the prior art, because a thin film is deposited on photoresists (a material of the thin film can be metal, indium tin oxide (ITO), etc. for manufacturing film layers of a thin film transistor), and while lifting off photoresists, thin film detrital matters are taken into a stripping solution (stripper), a lot of the thin film detrital matters can cause a filter device of a stripping-solution machine to be choked, so that causes the machine cannot be used, and all works on the stripping-solution machine are necessary to be stopped for waiting the filter device to be cleaned and then to be startup again, this reduces production efficiency.

SUMMARY OF INVENTION

Embodiments of the present disclosure provide a stripping-solution machine and a working method thereof, which can improve production efficiency.

On first aspect, an embodiment of the present disclosure provides a stripping-solution machine, including:

A plurality stages of chambers, which are arranged sequentially in order. Furthermore, each stage of the chambers is correspondingly connected to a storage box.

At least one filter device. Furthermore, one end of the filter device is disposed to be connected to a storage box corresponding to a current stage chamber by a first pipe, and another end of the filter device is connected to a next stage chamber by a second pipe.

Furthermore, a plurality of valve switches are at least disposed on the first pipe or the second pipe.

In several embodiments, the filter device includes a plurality of sub-filter devices arranged in a juxtaposition manner. The first pipe includes a plurality of first sub-pipes, each of the first sub-pipes is connected to one of the sub-filter devices, and the plurality of first sub-pipes are connected to the storage box corresponding to the current stage chamber.

In several embodiments, the second pipe includes a public sub-pipe and a plurality of second sub-pipes, each of the second sub-pipes is connected to one of the sub-filter devices, each of the second sub-pipes is connected to the public sub-pipe, and the public sub-pipe is connected to the next stage chamber.

In several embodiments, the plurality of valve switches are disposed on each of the first sub-pipes.

In several embodiments, the plurality of valve switches are disposed on each of the second sub-pipes.

In several embodiments, the plurality of valve switches are disposed on each of the first sub-pipes and each of the second sub-pipes.

In several embodiments, the second pipe includes a plurality of third sub-pipes, each of the third sub-pipes is connected to one of the sub-filter devices, and each of the third sub-pipes is connected to the next stage chamber.

In several embodiments, the plurality of valve switches are disposed on each of the third sub-pipes.

On second aspect, an embodiment of the present disclosure further provides a working method of a stripping-solution machine, including:

Arranging a plurality stages of chambers in order, providing a stripping solution to a peelable substrate stage by stage according to a transmission direction of the peelable substrate in a lift-off process.

Collecting the stripping solution that undergoes the lift-off process from a current stage chamber and storing the stripping solution in a storage box corresponding to the current stage chamber, wherein thin film detrital matters are mixed in the stripping solution.

Using a filter device corresponding to the current stage chamber to filter the stripping solution from the current stage chamber and transmitting the filtered stripping solution to a next stage chamber.

If the filter device is occluded by the thin film detrital matters, then turning off a valve switch on a pipe of the occluded filter device.

Taking out the occluded filter device.

In several embodiments, if the filter device is occluded by the thin film detrital matters, then turning off a valve on a pipe of the occluded filter device includes:

If the filter device includes a plurality of sub-filter devices arranged in a juxtaposition manner, then turning off a valve switch on a pipe of one of the occluded sub-filter device.

On third aspect, the present disclosure further provides a stripping-solution machine, including:

A plurality stages of chambers arranged sequentially in order. Furthermore, each stage of the chambers is correspondingly connected to a storage box.

At least one filter device. Furthermore, one end of the filter device is disposed to be connected to a storage box corresponding to a current stage chamber by a first pipe, and another end of the filter device is connected to a next stage chamber by a second pipe.

Furthermore, a plurality of valve switches are at least disposed on the first pipe or the second pipe. Furthermore, the filter device includes a plurality of sub-filter devices arranged in a juxtaposition manner, the first pipe includes a plurality of first sub-pipes, each of the first sub-pipes is connected to one of the sub-filter devices, and the plurality of first sub-pipes are connected to the storage box corresponding to the current stage chamber. Furthermore, the second pipe includes a public sub-pipe and a plurality of second sub-pipes, each of the second sub-pipes is connected to one of the sub-filter devices, each of the second sub-pipes is connected to the public sub-pipe, and the public sub-pipe is connected to the next stage chamber; or the second pipe includes a plurality of third sub-pipes, each of the third sub-pipes is connected to one of the sub-filter devices, and each of the third sub-pipes is connected to the next stage chamber.

The present disclosure further provides a stripping-solution machine, including: a plurality stages of chambers, which are arranged sequentially in order, wherein each stage of the chamber is correspondingly connected to a storage box; at least one filter device, wherein one end of the filter device is disposed to be connected to a storage box corresponding to a current stage chamber by a first pipe, and another end of the filter device is connected to a next stage chamber by a second pipe. Furthermore, a plurality of valve switches are at least disposed on the first pipe or the second pipe. The filter devices connected to each stage of the chambers are independent to each other by control of the valve switches, so that when the filter device is choked, the choked filter device is removed through the valve switch, and the entire lift-off process is not affected, so production efficiency is improved.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which those skilled in the art can derive further figures without making any inventive efforts.

DETAILED DESCRIPTION OF PREFERRED EMBODIMENTS

When current stripping-solution machines are working, if a filter device for filtering thin film detrital matters generated from lifting off photoresists is occluded, all working units in the stripping-solution machine need to be restarted to perform a lift-off process after the occluded filter device is cleaned. This makes the machine need to be stopped frequently to replace the filter device and greatly reduces production efficiency.

Figure 1:
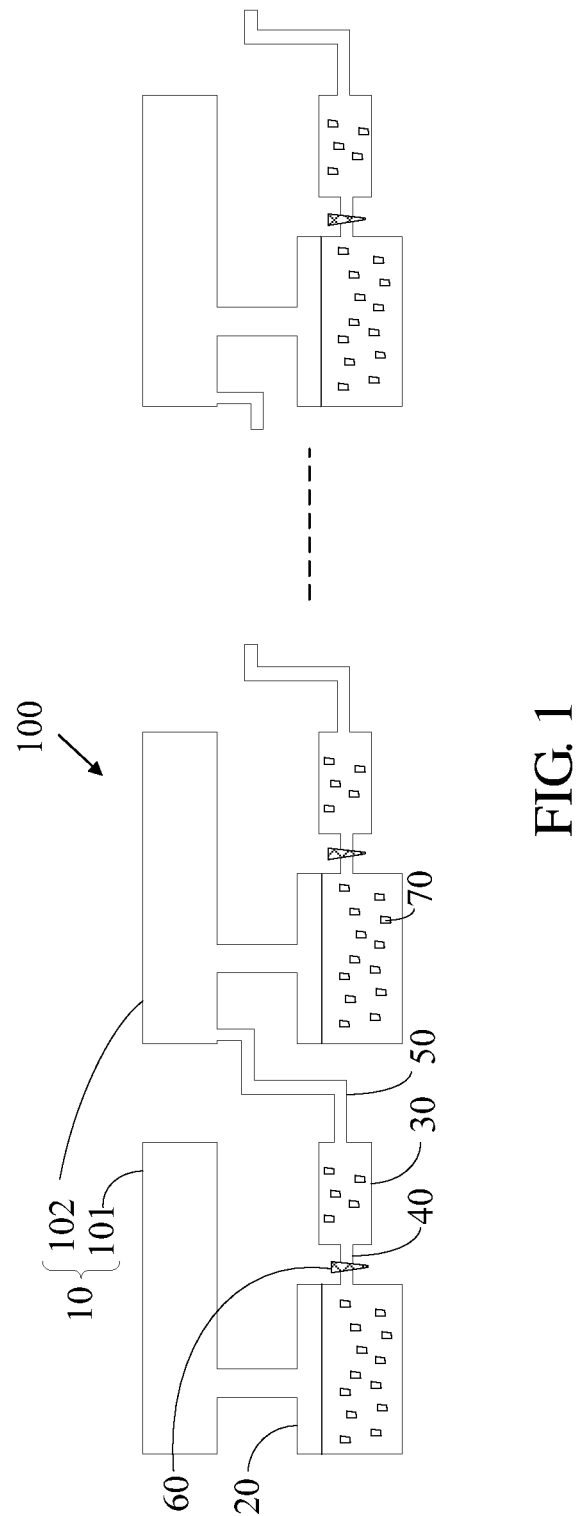
FIG. 1 is a first type structural schematic diagram of a stripping-solution machine provided by an embodiment of the present disclosure.

Please refer to FIG. 1, FIG. 1 is a first type structural schematic diagram of a stripping-solution machine 100 provided by an embodiment of the present disclosure.

The present disclosure provides a stripping-solution machine 100, including:

A plurality stages of chambers 10, which is arranged sequentially in order. Furthermore, each stage of the chambers 10 is correspondingly connected to a storage box 20.

At least one filter device 30. Furthermore, one end of the filter device 30 is disposed to be connected to a storage box 20 corresponding to a current stage chamber 101 by a first pipe 40, and another end of the filter device 30 is connected to a next stage chamber 102 by a second pipe 50.

Furthermore, a plurality of valve switches 60 are at least disposed on the first pipe 40 or the second pipe 50.

Specifically, illustrated in FIG. 1 is a schematic diagram that the valve switches 60 are disposed on the first pipe 40. When the current stage chamber 101 corresponding to the filter device 30 is occluded by thin film detrital matters, stopping a liquid between the storage box 20 corresponding to the current stage chamber 101 and the filter device 30 by the valve switch 60, so that the occluded filter device 30 is removed to be cleaned after the valve switch 60 is turned off, and this will not cause the lift-off process of the next stage chamber 102 cannot be continued.

Furthermore, the chambers 10 is used to provide the stripping solution to a peelable substrate stage by stage according to a transmission direction of the peelable substrate in a lift-off process. The plurality of storage boxes 20 are correspondingly connected to the plurality of chambers 10. Each stage of the chambers 10 are respectively connected to the corresponding storage box 20 through pipes. The storage box 20 is used to collect and store the stripping solution that undergoes the lift-off process from the current stage chamber 101. The filter device 30 is used to filter the stripping solution from the storage box 20 of the current stage chamber 101, and the filter device 30 can be connected to the next stage chamber 102 by the pipe, so that the filter device 30 can transmit the filtered stripping solution to the next stage chamber 102.

Each of the chambers 10 is designed to be performed a lift-off process suitably, and it is used to provide the stripping solution to a glass substrate in the process. A specific structure of the chambers can refer to a design in the prior art, and redundant description will not be mentioned herein. Each stage of the chambers 10 is respectively connected to the corresponding storage box 20 by the pipes. The stripping solution undergone the peeling-off process in the chambers can be transmitted to the storage box 20 by the pipes, and it can be collected and stored by the storage box 20. The storage box 20 of each stage of the chambers 10 is respectively connected to the corresponding filter device 30 by the pipe. After the stripping solution handled by the storage box 20 is filtered by the corresponding filter device 30, it is transmitted to the next stage chamber 102 by the pipe. In the present disclosure, a design same as the prior art can be used on the chambers 10 and the filter device 30.

The stripping solution is provided on the glass substrate in the peeling-off process from the current stage chamber 101 to each of the chambers 10 stage by stage according to the transmission direction of the glass substrate to perform the lift-off process. The stripping solution enters the corresponding storage box 20 from the current stage chamber 101, and when a water level of the stripping solution is higher than a predetermined height, the stripping solution flows into the filter device 30, and after the stripping solution is filtered by the filter device 30, the filtered stripping solution is transmitted into the next stage chamber 102. Furthermore, the thin film detrital matters 70 are often metal detrital matters or indium tin oxide (ITO) detrital matters.

Figure 2:
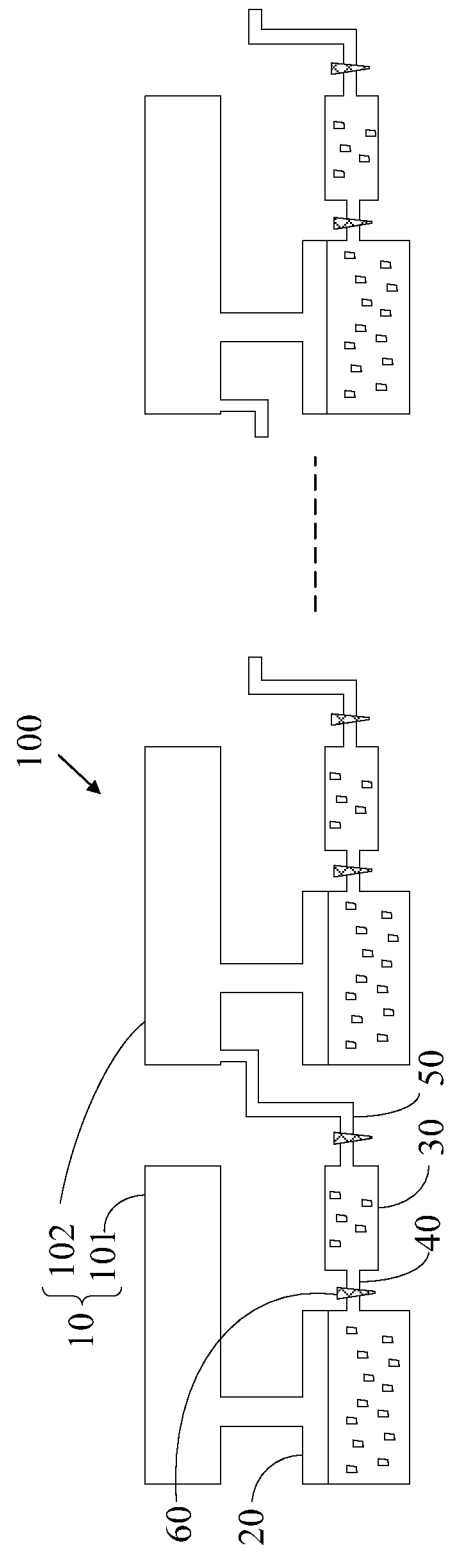
FIG. 2 is a second type structural schematic diagram of a stripping-solution machine provided by an embodiment of the present disclosure.

Furthermore, as illustrated in FIG. 2, which is a second type structural schematic diagram of a stripping-solution machine 100 provided by an embodiment of the present disclosure. The valve switches 60 are disposed on the first pipe 40 and the second pipe 50. When the filter device 30 is occluded, turning off the valve switches 60 located on the first pipe 40 and the second pipe 50 on two sides of the filter device 30, this can ensure the stripping solution in the storage box 20 corresponding to the current stage chamber 101 will not flow out, and meanwhile the stripping solution in the next stage chamber 102 will not flow out either.

Figure 3:
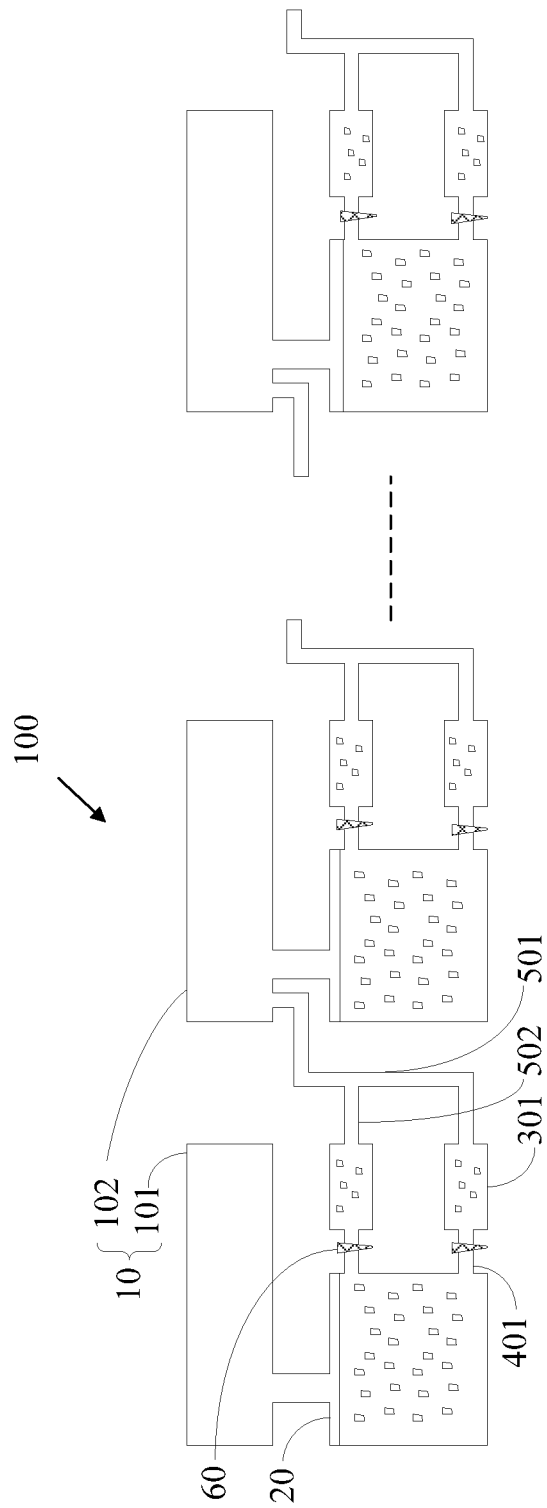
FIG. 3 is a third type structural schematic diagram of a stripping-solution machine provided by an embodiment of the present disclosure.

In several embodiments, please refer to FIG. 3, which is a third type structural schematic diagram of a stripping-solution machine 100 provided by an embodiment of the present disclosure. The filter device 30 includes a plurality of sub-filter devices 301 arranged in a juxtaposition manner. The first pipe 40 includes a plurality of first sub-pipes 401, each of the first sub-pipes 401 is connected to one of the sub-filter devices 301, and the plurality of first sub-pipes 401 are connected to the storage box 201 corresponding to the current stage chamber 101.

In several embodiments, the second pipe 50 includes a public sub-pipe 501 and a plurality of second sub-pipes 502. Each of the second sub-pipes 502 is connected to one of the sub-filter devices 301. Each of the second sub-pipes 502 is connected to the public sub-pipe 501, and the public sub-pipe 501 is connected to the next stage chamber 102.

Furthermore, the valve switches 60 are disposed on each of the first sub-pipes 301.

In several embodiments, the valve switches 60 are disposed on each of the first sub-pipes 401 and each of the second sub-pipes 502.

In several embodiments, the valve switches 60 are disposed on each of the second sub-pipes 502.

Specifically, positions of the valve switches 60 can be disposed on any pipe connected to the filter device 30, and redundant description will not be mentioned herein.

Figure 4:
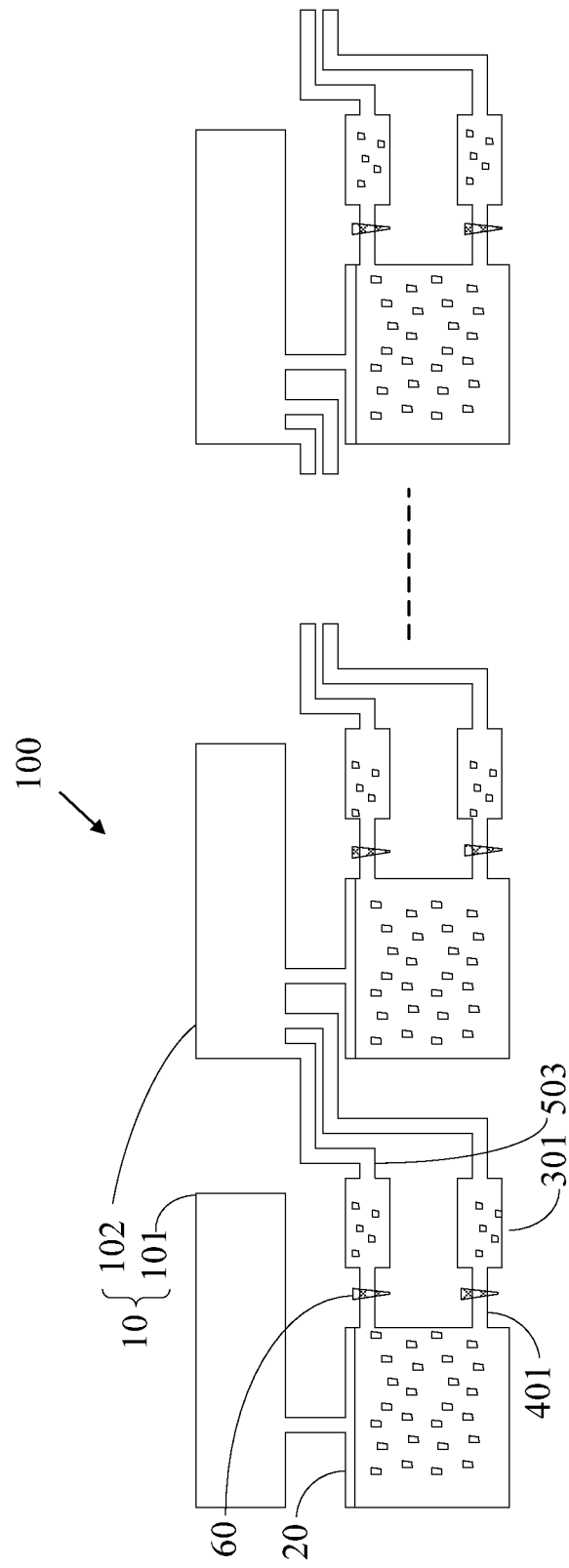
FIG. 4 is a fourth type structural schematic diagram of a stripping-solution machine provided by an embodiment of the present disclosure.

In several embodiments, please refer to FIG. 4, FIG. 4 is a fourth type structural schematic diagram of a stripping-solution machine 100 provided by an embodiment of the present disclosure. The second pipe 50 includes a plurality of third sub-pipes 503. Each of the third sub-pipes 503 is connected to one of the sub-filter devices 301, and each of the third sub-pipes 503 is connected to the next stage chamber 102.

Furthermore, the valve switches 60 are disposed on each of the third sub-pipes 503.

The stripping-solution machine provided by the present disclosure includes: a plurality stages of chambers, which are arranged sequentially in order, and each stage of the chamber is correspondingly connected to a storage box; at least one filter device, wherein one end of the filter device is disposed to be connected to a storage box corresponding to a current stage chamber by a first pipe, and another end of the filter device is connected to a next stage chamber by a second pipe. Furthermore, a plurality of valve switches are at least disposed on the first pipe or the second pipe. The filter devices connected to each stage of the chambers by control of the valve switches are independent to each other, so that when the filter device is occluded, due to the valve switch, the occluded filter device can be removed, and the entire lift-off process is not affected, and this improves production efficiency.

Figure 5:
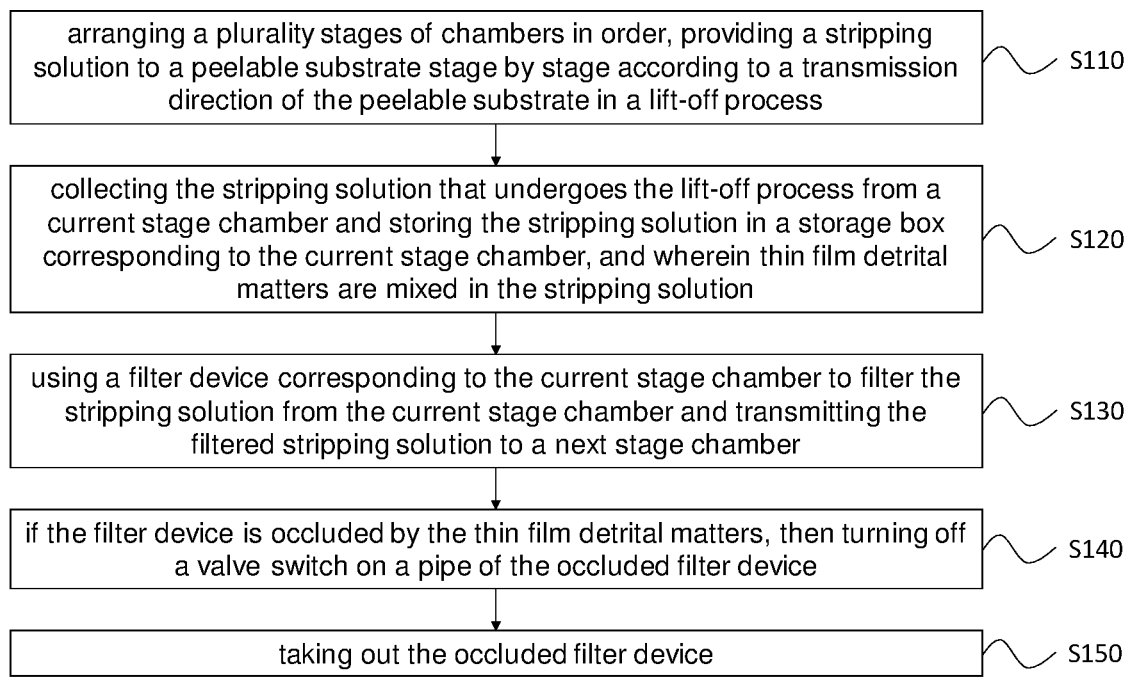
FIG. 5 is a flowchart of a stripping-solution machine provided by an embodiment of the present disclosure.

An embodiment of the present disclosure further provides a working method of a stripping-solution machine. Please refer to FIG. 5, FIG. 5 is a flowchart of the stripping-solution machine provided by the embodiment of the present disclosure. The method includes:

A step 110: arranging a plurality stages of chambers in order, providing a stripping solution to a peelable substrate stage by stage according to a transmission direction of the peelable substrate in a lift-off process.

A step 120: collecting the stripping solution that undergoes the lift-off process from a current stage chamber and storing the stripping solution in a storage box corresponding to the current stage chamber. Furthermore, thin film detrital matters are mixed in the stripping solution.

A step 130: using a filter device corresponding to the current stage chamber to filter the stripping solution from the current stage chamber and transmitting the filtered stripping solution to a next stage chamber.

A step 140: if the filter device is occluded by the thin film detrital matters, then turning off a valve switch on a pipe of the occluded filter device.

A step 150: taking out the occluded filter device.

If the filter device includes a plurality of sub-filter devices arranged in a juxtaposition manner, then turning off a valve switch on a pipe of one of the occluded sub-filter device, therefore the step 140 can further includes:

If the filter device includes a plurality of sub-filter devices arranged in a juxtaposition manner, then turning off the valve switch on a pipe of the occluded sub-filter device.

An embodiment of the present disclosure further provides a stripping solution machine, which includes:

A plurality stages of chambers, which are arranged sequentially in order. Furthermore, each stage of the chamber is correspondingly connected to a storage box.

At least one filter device. Furthermore, one end of the filter device is disposed to be connected to a storage box corresponding to a current stage chamber by a first pipe, and another end of the filter device is connected to a next stage chamber by a second pipe.

A plurality of valve switches are at least disposed on the first pipe or the second pipe. The filter device includes a plurality of sub-filter devices arranged in a juxtaposition manner. The first pipe includes a plurality of first sub-pipes. Each of the first sub-pipes is connected to one of the sub-filter devices, and the plurality of first sub-pipes are connected to the storage box corresponding to the current stage chamber. The second pipe includes a public sub-pipe and a plurality of second sub-pipes, each of the second sub-pipes is connected to one of the sub-filter devices, each of the second sub-pipes is connected to the public sub-pipe, and the public sub-pipe is connected to the next stage chamber; or the second pipe includes a plurality of third sub-pipes, each of the third sub-pipes is connected to one of the sub-filter devices, and each of the third sub-pipes is connected to the next stage chamber.

In the embodiments mentioned above, the descriptions to the various embodiments are emphasized, and the part is not described in detailed in an embodiment, can refer to the detailed description of other embodiments mentioned above.

The embodiments of present disclosure are described in detail above. This article uses specific cases for describing the principles and the embodiments of the present disclosure, and the description of the embodiments mentioned above is only for helping to understand the method and the core idea of the present disclosure. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present disclosure.

What is claimed is:

1. A stripping-solution machine, comprising:
   a plurality stages of chambers arranged sequentially in order, wherein each stage of the chamber is correspondingly connected to a storage box; and
   at least one filter device, wherein one end of the filter device is disposed to be connected to a storage box corresponding to a current stage chamber by a first pipe, and another end of the filter device is connected to a next stage chamber by a second pipe,
   wherein a plurality of valve switches are at least disposed on the first pipe or the second pipe.

2. The stripping-solution machine as claimed in claim 1, wherein the filter device comprises a plurality of sub-filter devices, the first pipe comprises a plurality of first sub-pipes, each of the first sub-pipes is connected to one of the sub-filter devices, and the plurality of first sub-pipes are connected to the storage box corresponding to the current stage chamber.

3. The stripping-solution machine as claimed in claim 2, wherein the second pipe comprises a public sub-pipe and a plurality of second sub-pipes, each of the second sub-pipes is connected to one of the sub-filter devices, each of the second sub-pipes is connected to the public sub-pipe, and the public sub-pipe is connected to the next stage chamber.

4. The stripping-solution machine as claimed in claim 3, wherein the plurality of valve switches are disposed on each of the first sub-pipes.

5. The stripping-solution machine as claimed in claim 3, wherein the plurality of valve switches are disposed on each of the second sub-pipes.

6. The stripping-solution machine as claimed in claim 3, wherein the plurality of valve switches are disposed on each of the first sub-pipes and each of the second sub-pipes.

7. The stripping-solution machine as claimed in claim 2, wherein the second pipe comprises a plurality of third sub-pipes, each of the third sub-pipes is connected to one of the sub-filter devices, and each of the third sub-pipes is connected to the next stage chamber.

8. The stripping-solution machine as claimed in claim 7, wherein the plurality of valve switches are disposed on each of the third sub-pipes.

9. A working method of a stripping-solution machine, comprising:
   arranging a plurality stages of chambers in order, providing a stripping solution to a peelable substrate stage by stage according to a transmission direction of the peelable substrate in a lift-off process;
   collecting the stripping solution that undergoes the lift-off process from a current stage chamber and storing the stripping solution in a storage box corresponding to the current stage chamber, wherein thin film detrital matters are mixed in the stripping solution;
   using a filter device corresponding to the current stage chamber to filter the stripping solution from the current stage chamber and transmitting the filtered stripping solution to a next stage chamber;
   if the filter device is occluded by the thin film detrital matters, then turning off a valve switch on a pipe of the occluded filter device; and
   taking out the occluded filter device.

10. The working method of the stripping-solution machine as claimed in claim 9, wherein if the filter device is occluded by the thin film detrital matters, then turning off the valve on the pipe of the occluded filter device comprises:
    if the filter device comprises a plurality of sub-filter devices, then turning off a valve switch on a pipe of the occluded sub-filter device.

11. A stripping-solution machine, comprising:
    a plurality stages of chambers arranged sequentially in order, wherein each stage of the chamber is correspondingly connected to a storage box; and
    at least one filter device, wherein one end of the filter device is disposed to be connected to a storage box corresponding to a current stage chamber by a first pipe, and another end of the filter device is connected to a next stage chamber by a second pipe,
    wherein a plurality of valve switches are at least disposed on the first pipe or the second pipe; the filter device comprises a plurality of sub-filter devices, the first pipe comprises a plurality of first sub-pipes, each of the first sub-pipes is connected to one of the sub-filter devices, and the plurality of first sub-pipes are connected to the storage box corresponding to the current stage chamber; the second pipe comprises a public sub-pipe and a plurality of second sub-pipes, each of the second sub-pipes is connected to one of the sub-filter devices, each of the second sub-pipes is connected to the public sub-pipe, and the public sub-pipe is connected to the next stage chamber; or the second pipe comprises a plurality of third sub-pipes, each of the third sub-pipes is connected to one of the sub-filter devices, and each of the third sub-pipes is connected to the next stage chamber.

* * * * *